United States Patent [19]
Wagers

[11] 4,016,440
[45] Apr. 5, 1977

[54] PARTICULARLY ORIENTED PLATE-LIKE MONOCRYSTALLINE PIEZOELECTRIC BODY AND ACOUSTIC SURFACE WAVE FILTER DEVICE EMPLOYING SAME

[75] Inventor: Robert S. Wagers, Richardson, Tex.

[73] Assignee: Texas Instruments Incorporated, Dallas, Tex.

[22] Filed: May 21, 1975

[21] Appl. No.: 579,340

Related U.S. Application Data

[63] Continuation-in-part of Ser. No. 473,850, May 28, 1974, abandoned.

[52] U.S. Cl. .................................. 310/9.5; 310/9.8
[51] Int. Cl.² ......................................... H01L 41/04
[58] Field of Search ................. 310/8, 8.1, 9.5, 9.7, 310/9.8; 333/30 R, 72

[56] References Cited

UNITED STATES PATENTS

| 3,601,639 | 8/1971 | Hannon et al. | 310/9.5 |
| 3,906,410 | 9/1975 | Williams | 310/9.5 X |

OTHER PUBLICATIONS

Ultrasonic Transducers by Deklerk, Ultrasonics, Jan. 1971, pp. 35-48.
Applied Physics Letters, vol. 18, No. 9, May 1, 1971, pp. 393-394.

Primary Examiner—Mark O. Budd
Attorney, Agent, or Firm—Harold Levine; James T. Comfort; William E. Hiller

[57] ABSTRACT

This disclosure concerns a particularly oriented plate-like monocrystalline piezoelectric body of lithium niobate for use as a substrate in an acoustic surface wave filter device, wherein the orientation of the piezoelectric body of lithium niobate is responsible for a substantial reduction in spurious responses including plate modes. More specifically, the piezoelectric body comprises a plate of lithium niobate having a crystalline lattice orientation as determined by a 46° (ZYW) cut. It has been determined that such a piezoelectric body may be employed as a substrate in an acoustic surface wave filter device to effect an improved filter response in that unwanted spurious responses including those caused by plate modes are removed or substantially reduced from the acoustic signals prior to their conversion into electrical output signals.

5 Claims, 8 Drawing Figures

PLATE MODE COUPLING SPECTRUM — (YZ) CUT
LITHIUM NIOBATE SUBSTRATE WITH THICKNESS
Kh = 60.0

PLATE MODE COUPLING SPECTRUM - -41.5°(ZXL) CUT
LITHIUM NIOBATE SUBSTRATE WITH THICKNESS
Kh = 60.0

PLATE MODE COUPLING SPECTRUM - (ZY) CUT
LITHIUM NIOBATE SUBSTRATE WITH THICKNESS
Kh = 60.0

RELATIVE VELOCITY
PLATE MODE COUPLING SPECTRUM − 46°(ZYW) CUT
LITHIUM NIOBATE SUBSTRATE WITH THICKNESS
$K_h = 60.0$

46° (ZYW) CUT — LITHIUM NIOBATE

PARTICULARLY ORIENTED PLATE-LIKE MONOCRYSTALLINE PIEZOELECTRIC BODY AND ACOUSTIC SURFACE WAVE FILTER DEVICE EMPLOYING SAME

This application is a continuation-in-part of application Ser. No. 473,850, filed May 28, 1974, now abandoned.

This invention relates to a piezoelectric body for use as a substrate in an acoustic surface wave filter device, wherein the piezoelectric body comprises a plate-like monocrystalline member made of lithium niobate and having a crystalline lattice orientation as determined by a 46° (ZYW) cut to substantially enhance plate mode discrimination.

Acoustic surface wave devices have received increasing attention for possible application as filters, delay lines and the like. Acoustic surface wave devices have particular application in frequency ranges between 10 MHz and 1 GHz because of their compact nature and other advantages as compared to inductive capacitive type filters and tuned electromagnetic waveguides. In the latter respect, the much slower speed at which the acoustic waves travel as compared to electromagnetic waves enables the size of an acoustic surface wave device to be correspondingly smaller of the order of $10^5$.

When used in filtering applications, acoustic surface wave devices commonly comprise a piezoelectric substrate on which a pair of spaced-apart transducers are disposed. Typically, these transducers are of the interdigital type, wherein a plurality of fingers extend from opposed transducer pads in overlapping relation to each other. Electric fields created between the overlapping fingers of the interdigital transducer excite the piezoelectric material of the substrate to generate the surface waves. However, these interdigital transducers in addition to producing an acoustic surface wave in response to electrical excitation thereof will also produce spurious acoustic responses referred to as spurious mode excitation. This spurious mode excitation represents a serious source of distortion in acoustic surface wave bandpass filter devices. In parallelepiped substrate geometry, the substrates of piezoelectric material employed in acoustic surface wave bandpass filter devices have parallel top and bottom surfaces giving rise to spurious mode excitation which may be characterized as plate modes. In the article, "Plate Mode Resonances in Surface Wave Delay Lines" by R. S. Wagers, published in the *IEEE Ultrasonics Symposium Proceedings*, Monterey, Calif. (November 1973), the total response of an acoustic surface wave transducer was shown to be described by a superposition of the entire plate mode spectrum when the coupling strengths and phase relations of the modes are taken into account. Generally, the spurious plate modes have group velocities different from that of the desired Rayleigh mode. Thus, the energy carried by these spurious plate modes traverses the acoustic surface wave filter device with time delays different from those of the primary mode, the Rayleigh mode. This time delay difference results in image responses with temporal separation at the output terminal of the surface wave filter device.

Although phase distortion from modes that are 20 to 30 dB below the main mode may be acceptable for some applications in which an acoustic surface wave filter device may be employed, the use of such a filter device for television IF filtering would result in visible spurious signals appearing on the cathode ray tube of the television receiver. Since the group velocity differential between the Rayleigh and plate modes is relatively small, the temporal separation between "ghost" responses carried by the "near-in" plate modes is also small such that plate mode image responses would be removed from the main image by distances on the cathode ray tube on the order of 20–30 mils. Therefore, the effect of the plate modes present in the output of an acoustic surface wave filtering device as employed in the IF stages of a television receiver would be to blur the edges of the images on the cathode ray tube, rather than giving separate distinct ghosts with large spatial separation thereon.

Heretofore, the type of spurious signals thought to be causing problems of the foregoing character have been characterized in the art as propagating bulk modes. However, as noted in pending U.S. application Ser. No. 429,476, filed Dec. 28, 1973, now U.S. Pat. No. 3,887,887 issued June 3, 1975, it has been determined that for parallelepiped substrate geometry the modes in question are not truly bulk modes but are plate modes. The latter pending U.S. application discloses one technique for eliminating or substantially reducing the effect of spurious plate mode interference in acoustic surface wave filter devices, wherein the plate modes, after their excitation, are eliminated from the substrate prior to reception by an output acoustic surface wave transducer disposed on the substrate.

Application Ser. No. 473,850, filed May 28, 1974, now abandoned of which the present application is a continuation-in-part, describes a different approach from that set forth in pending U.S. application Ser. No. 429,476, filed Dec. 28, 1973, now U.S. Pat. No. 3,887,887 issued June 3, 1975, wherein the presence of plate mode interference as spurious signals produced by an interdigital transducer on an acoustic surface wave filter device is eliminated or substantially reduced in the generation of surface waves upon electrical excitation of an interdigital transducer disposed on the substrate. The aforesaid application Ser. No. 473,850, filed May 28, 1974, now abandoned, proposed a monocrystalline plate-like body of lithium niobate having a crystalline lattice orientation at least sufficiently corresponding to a (ZY) cut as the substrate in an acoustic surface wave filter device as a means to achieve significant enhancement in the degree to which discrimination against plate mode interference exists. It was suggested that the crystalline lattice orientation of such a plate-like substrate of lithium niobate could achieve a sufficiently satisfactory degree of plate mode discrimination by maintaining plate modes adjacent the Rayleigh mode in an uncoupled state to enable the substrate to be employed in an acoustic surface wave filter device for IF filtering in a television receiver.

It has been subsequently determined, however, that for narrow aperture transducers on a substrate of (ZY) cut lithium niobate, the nominally uncoupled plate modes adjacent to the Rayleigh mode can be excited at unacceptably large levels. In this connection, the nominally uncoupled plate modes are affected by the sensitivity of the (ZY) cut lithium niobate substrate to the exact crystal cut, the exact transducer alignment along the Y axis, and the width of the transducer. For example, misalignment of the transducer on the (ZY) cut lithium niobate substrate, even to ¼°, substantially affects whether these plate modes remain uncoupled. Errors in meeting precise specifications relating to the foregoing factors tend to yield aggregate coupled plate mode levels in the −30 dB to −40 dB range. Moreover, diffraction in the transducer which has a finite width produces an angular spectrum of electric potential components, and the off-axis components excite the near-in plate modes at small angles off the Y axis, resulting in spurious plate mode interference in the acoustic response which is carried over in the electrical output signal of the transducer causing distortion of the electrical output signal.

It is proposed herein to provide a monocrystalline plate-like body of lithium niobate having a crystalline lattice orientation of a character substantially limiting the number of plate modes which could be coupled, thereby substantially reducing plate mode interference as produced by an interdigital transducer in an acoustic surface wave filter device, where such a lithium niobate body is the substrate, in the generation of surface waves by the transducer when it is electrically excited. In a preferred form, the lithium niobate plate-like body has a crystalline lattice orientation as determined by a 46° (ZYW) cut, wherein the lithium niobate crystal is oriented 46° above the Y axis, with the plate normal being between the +Z and −Y axes. Such an orientation so locates the Rayleigh wave that it is appreciably separated from the sheer wave branches of the lithium niobate crystal in an inverse velocity plot so that there are no near-in plate modes available to be coupled. The occurrence of plate mode interference in the acoustic response of a transducer disposed on a lithium niobate substrate with this particular crystalline orientation is thereby virtually eliminated. In accordance with broader aspects of the concept herein disclosed, the crystalline lattice orientation of a plate-like body of lithium niobate may be determined by a cut lying within a range of 60°–30° (ZYW) cut, while still providing a sufficient degree of plate mode discrimination to enable the lithium niobate body to be utilized as a substrate in an acoustic surface wave device for filtering applications in television IF stages.

Cuts of lithium niobate plate-like bodies in this range also provide a variance in electrical coupling across the range with respect to coupling of the Rayleigh mode. In this respect, the Rayleigh mode coupling across this range extends from a value of approximately eight times that of the Rayleigh mode coupling in a standard ST cut quartz substrate to a value of approximately 100% that of the conventional (YZ) cut of lithium niobate. Thus, in designing a filter employing an acoustic surface wave device with a plate-like lithium niobate substrate, the cut thereof can be determined within the range of a 60° − 30° (ZYW) cut in a manner appropriate to the filter requirements, as for example when it is desired to have a relatively limited electrical coupling to the Rayleigh wave mode.

The plate-like monocrystalline substrate of lithium niobate having a crystalline orientation as determined in accordance with the foregoing description is employed in an acoustic surface wave filter device having at least one acoustic surface wave transducer means disposed thereon and responsive to an electrical input signal to propagate acoustic surface waves in the substrate, wherein the transducer is preferably of the interdigital type having opposing pads with alternating fingers extending therefrom into overlapping relationship.

The objects and advantages of the invention will be better understood from the following description when read in connection with the accompanying drawings, in which.

Figure 1:
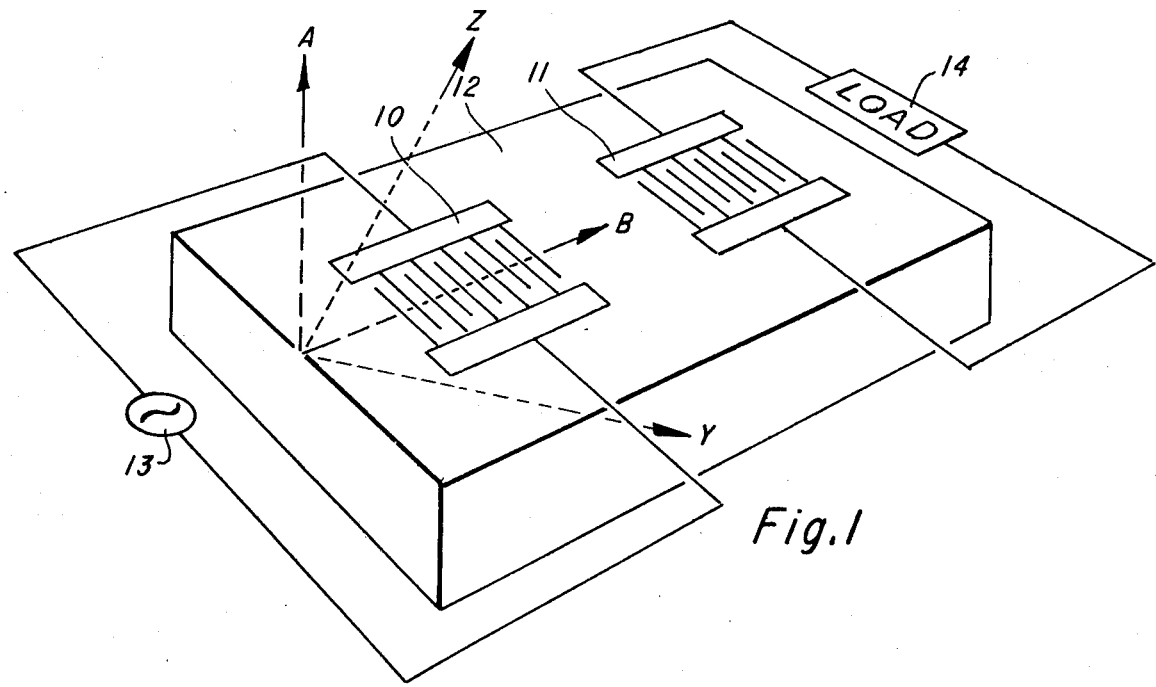
FIG. 1 is a perspective view, partially diagrammatic in character, illustrating an acoustic surface wave filter device having a lithium niobate substrate whose crystalline lattice orientation is determined by a cut in accordance with the present invention.

Referring more specifically to the drawings, FIG. 1 illustrates a typical acoustic surface wave filter structure employing input and output acoustic surface wave transducers 10, 11 disposed on a substrate 12 of piezoelectric material. Preferably, the transducer 10, 11 are of the interdigital type in which opposing transducer pads are provided with respective pluralities of fingers, the fingers of one pad alternating in sequence with the fingers of the other pad in a partially overlapping relationship. The interdigital transducers 10, 11 may respectively comprise patterned depositions of metal on the surface of the piezoelectric substrate 12 in the well-known manner, the input transducer 10 being connected to a source 13 of electrical energy for excitation purposes and the output transducer 11 being connected to a load 14. This type of acoustic surface wave device is commonly employed in filtering application. Where used as a bandpass filter, such devices heretofore have been subject to spurious acoustic responses. These spurious acoustic responses are best characterized as plate modes as hereinbefore explained for parallelepiped substrate geometry. In accordance with the present invention, it has been determined that the substrate 12 of the acoustic wave filter device illustrated in FIG. 1 may be so constructed as to eliminate or substantially reduce the occurrence of undesired plate modes in the output signal upon excitation of the input transducer 10 by electrical energy from the source 13, wherein the transducer 10 generates surface waves in the surface of the piezoelectric substrate 12.

To this end, the substrate 12 may be formed of a plate-like monocrystalline configuration of lithium niobate wherein the crystalline lattice orientation of the substrate 12 is determined by a cut defining a propagation plane axis B and a normal plane axis A illustrated in relation to the Z and Y axes corresponding to a (ZY) cut as disclosed in application Ser. No. 473,850, filed May 28, 1974, now abandoned. In the particular instance shown in FIG. 1, the axis B of the lithium niobate substrate 12 is oriented 46° above the Y axis, with the axis A being between the +Z and −Y axes. It has been found that this crystalline lattice orientation of a lithium niobate substrate substantially enhances the ability of the substrate to discriminate against undesirable plate modes upon being subjected to excitation.

It has been determined within broader aspects of the concept herein disclosed that a substrate of lithium niobate of parallelepiped geometry may effectively discriminate against plate modes for purposes of being utilized for filtering applications in television IF stages, provided its crystalline lattice orientation is determined by a cut lying within a range of 60°–30° (ZYW) cut.

Figure 2:
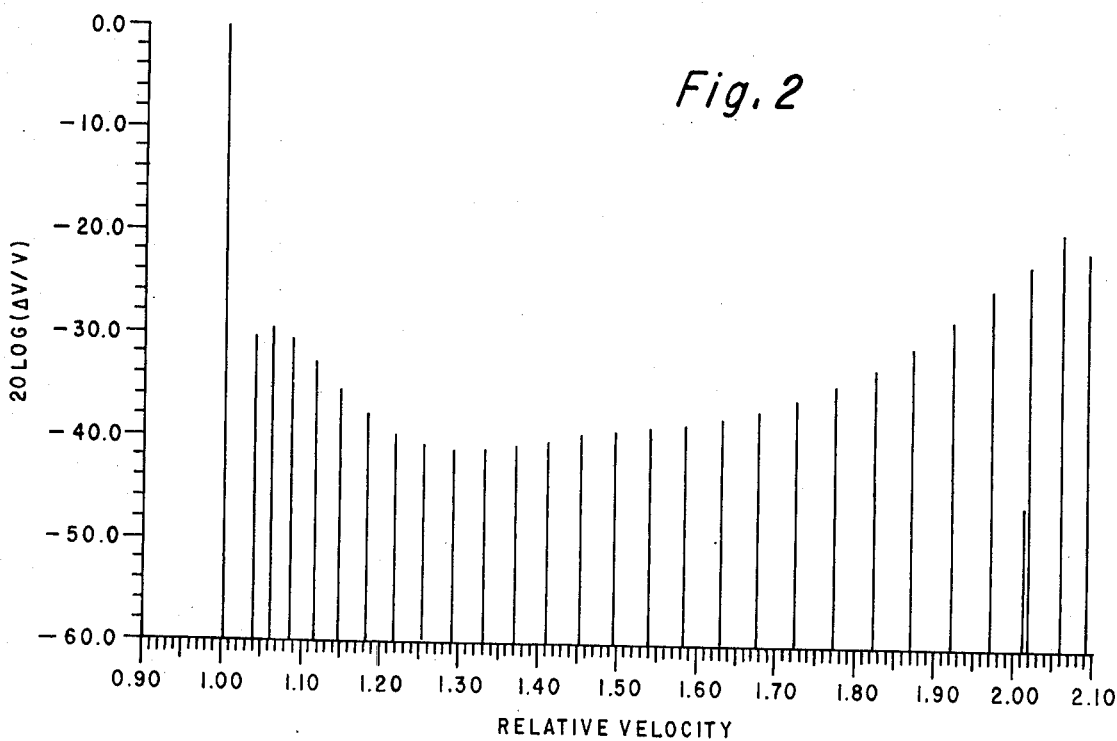
FIG. 2 is a graph representing the plate mode coupling spectrum of a (YZ) cut lithium niobate substrate whose thickness Kh is 60.0.

In order to better explain the significance of the crystalline lattice orientation of the monocrystalline plate-like substrate of lithium niobate, it would be helpful to consider how the presence of undesirable plate modes adversely affects the performance of the commonly employed cut of (YZ) lithium niobate, for example, as a substrate material for an acoustic surface wave filtering device employing interdigital acoustic surface wave transducer means thereon. To this end, FIG. 2 illustrates a graph for (YZ) cut lithium niobate substrate material having a thickness $Kh = 2\pi h/\lambda = 60$, with $\lambda =$ wavelength and $h =$ substrate thickness. The graph shows the coupling levels for the plate mode spectrum. In this connection, the mode strengths are referenced to the desired surface wave Rayleigh mode which is assumed to have a strength of zero dB and a relative velocity of 1.0. Referring to FIG. 2, the higher velocity plate mode is shown to be only approximately 30 dB below the Rayleigh mode. This level would be unacceptable for such a substrate in a television IF filtering stage application as the substrate of an acoustic surface wave filter device, since such a plate mode would be visible on the cathode ray tube of the television receiver.

Figure 3:
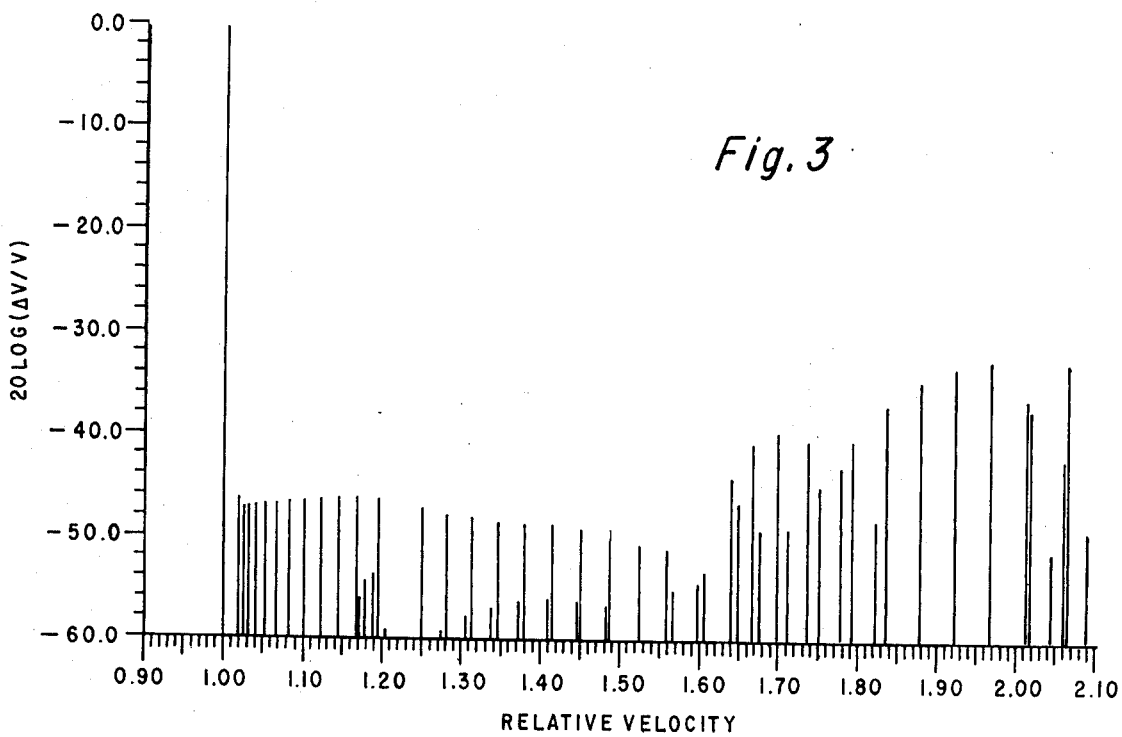
FIG. 3 is a graph representing the plate mode coupling spectrum of a 41.5° rotated cut of a lithium niobate substrate having a thickness Kh of 60.0.

Other investigations directed at measuring spurious signal activity in acoustic surface wave devices have considered a 41.5° rotated cut of lithium niobate, which appeared to have lower spurious response than comparable substrates of (YZ) cut lithium niobate. The graph shown in FIG. 3 shows the plate mode coupling levels for this substrate. For this 41.5° rotated cut of lithium niobate plate-like substrate, the figure of merit expressed as 20 log ($\Delta V/V$) of the plate modes near the Rayleigh mode was determined to be on the order of 45 dB below the Rayleign mode for a lithium niobate substrate of approximately 9.5 wavelengths thick. However, the 41.5° rotated cut of lithium niobate is subject to certain adverse factors not readily apparent at first glance. In this connection, an interdigital transducer as disposed on such a cut of lithium niobate does not have a high Q value. Therefore, the figure of merit expressed as 20 log ($\Delta V/V$) does not translate directly into differential insertion loss for the modes. The separation between modes is in fact less. A portion of the lost differential comes from the fact that the acoustic impedance of the Rayleigh mode tunes the near-by plate modes. Another factor causing the plate mode level at the output of an acoustic surface wave filter device employing a 41.5° rotated cut of lithium niobate to be higher than indicated by a plot of 20 log ($\Delta V/V$) is that the signals of each of the near-in plate modes add essentially in phase at the output. Accordingly, every pair of near-in modes raises the level 6 dB. For a 41.5° rotated cut of lithium niobate, so many modes exist that this effect becomes quite significant such that in practice the plate mode level is only about 30 dB below the Rayleigh response which is inadequate for a piezoelectric substrate of parallelepiped geometry when employed in an acoustic surface wave filter device for televison IF frequency stages.

For truly effective results, a parallelepiped piezoelectric substrate for surface wave filter application in television IF stages requires a greater degree of discrimination against plate modes than has heretofore been known. In an effort to achieve enhanced plate mode discrimination in such a substrate, copending application Ser. No. 473,850 filed May 28, 1974, now abandoned proposed the following set of criteria as potentially leading to a substantially distortion-free cut of a piezoelectric crystal as a substrate for surface wave filter application:

1. there should be a large difference in the velocities of the on-axis shear waves;
2. the slower of these two bulk shear waves should have polarization that is essentially perpendicular to the plane of the cut and propagation axes, i.e., the sagittal plane; and
3. the propagation direction and cut should result in a disposition of elements in the piezoelectric strain matrix such that $$e_{x6} = e_{z4} = 0$$

and $$e_{x4} = -e_{z6},$$

where $z$ is the spatial (not crystal) coordinate parallel to the crystal cut and $x$ is the spatial coordinate parallel to the propagation direction.

In arriving at this set of criteria, the following factors were considered. First, all material plates can support families of acoustic modes which propagate along the plate reflecting partial waves from top and bottom surfaces of the plate in a manner that achieves transverse resonance of the bulk modes. Basically, these families of modes are the SH (shear horizontal) shear modes with polarization perpendicular to the sagittal plane and Lamb waves with polarization in the sagittal plane. The sagittal plane is defined as the plane passing through the direction of cut and the direction of propagation in the monocrystalline piezoelectric substrate. For anisotropic materials, these polarization deviate from being purely perpendicular or parallel to the sagittal plane. Usually the family of SH modes has velocities greater than the Rayleigh wave velocity and the family of Lamb modes begins at a velocity greater than the starting velocity of the SH modes. In anisotropic materials with non-degenerate on-axis bulk shear wave velocities, three distinct classes of mode coupling strengths appear, each with an onset velocity corresponding approximately to that of the on-axis bulk mode velocities. It was determined that by separating these classes of modes, cuts and propagation directions of piezoelectric material might be found that have wide quiescent bands around the Rayleigh mode where no modes are coupled to an electric potential, i.e., no mode can be excited by an interdigital transducer. To satisfy criterion (1) therefore, crystalline lattice orientations were sought where only one family of modes with velocities near to that of the Rayleigh mode would be present such that only this family of modes and the Rayleigh mode could possibly by synchronous with the interdigital transducer at frequencies close to the bandpass of interest.

To satisfy criterion (2), the family of modes near the Rayleigh mode determined by criterion (1) should be the family that corresponds to the SH modes of isotropic plates. Finally, criterion (3) upon being satisfied would provide that the polarization of the family of modes near the Rayleigh modes be decoupled from the electric potential such that the interdigital transducer would not be capable of exciting the same. Thus, undesired plate modes that do exist would be uncoupled, thereby enabling the piezoelectric plate-like substrate to substantially discriminate against undesired plate modes.

Acting upon this set of criteria, it was determined that a (ZY) cut of plate-like monocrystalline lithium niobate material substantially discriminated against plate modes by uncoupling same so as to avoid their occurrence in the electrical output signal from a substrate of such material when employed in an acoustic surface wave filter device having acoustic surface wave transducer means of the interdigital type disposed thereon.

Figures 5, 6:
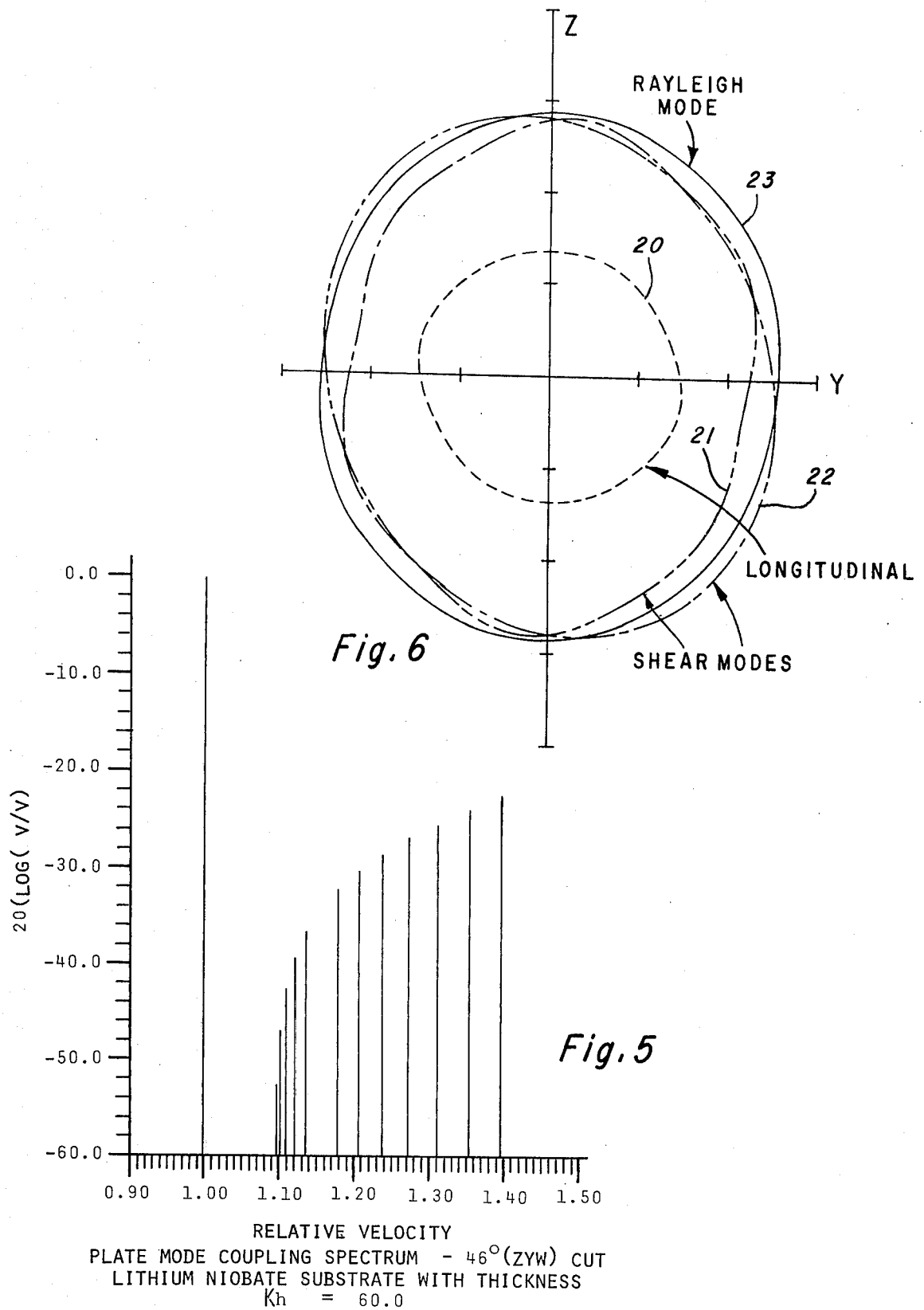
FIG. 5 is a graph representing the plate mode coupling spectrum of a 46° (ZYW) cut of a lithium niobate substrate having a thickness Kh of 60.0 in accordance with a preferred aspect of the present invention.
FIG. 6 is a graph representing inverse velocity plots for the three acoustic bulk modes propagating in the YZ plane of an infinite monocrystalline lithium niobate medium and the Rayleigh wave mode for a plate-like monocrystalline substrate of lithium niobate in which the sagittal plane lies in the YZ plane of the crystal lattice.

Inverse velocity plots such as illustrated in FIG. 6 perhaps best demonstrate the significance of criterion (1). Such inverse velocity plots give the reciprocal of the plane wave velocity in an infinite medium as a function of propagation direction for the three acoustic bulk modes. In FIG. 6 which is a polar plot, the curves are for plane wave propagation with K vector in the YZ plane of lithium niobate. The inner curve 20 is for the longitudinal wave and the outer curves 21, 22 and 23 respectively represent the two shear waves 21, 22 and the Rayleigh wave 23. The slower a wave velocity is, the further from the origin is the plot. For propagation in the Y direction, the shear velocities are separated by a significant margin—the greater the separation, the better for filter applications in satisfying criterion (1).

In satisfying criterion (2), the slow shear wave branch 22 as illustrated in FIG. 6 should have particle displacement polarization perpendicular to the sagittal plane. If that condition is obtained, and criterion (3) which puts a constraint on the piezoelectric coefficients is satisfied, then the family of modes associated with the slow shear wave will be electrically uncoupled, and the first modes coupled to the transducer will have velocities approximately greater than or equal to the on-axis fast shear wave velocity. For the case illustrated in FIG. 6, the slow shear waves 22 are in fact polarized perpendicular to the sagittal plane.

Figure 4:
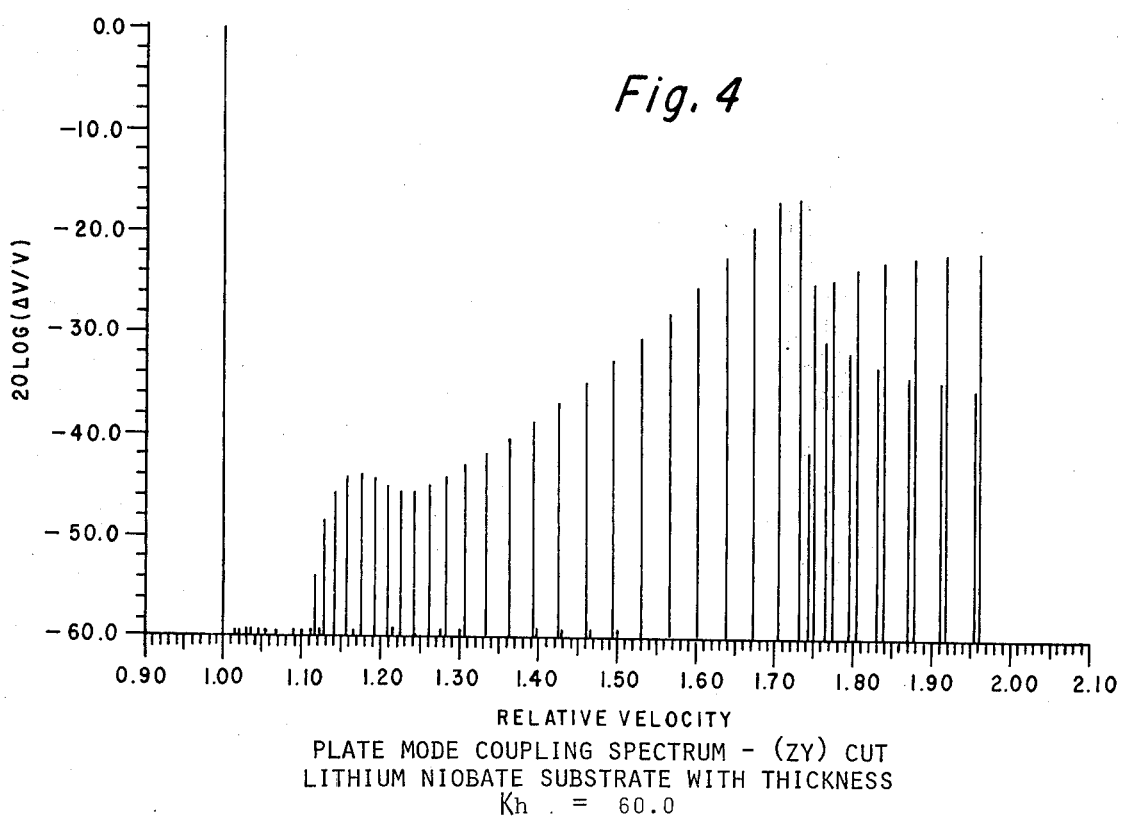
FIG. 4 is a graph representing the plate mode coupling spectrum for a (ZY) cut lithium niobate substrate as described in application Ser. No. 473,850, filed May 28, 1974, now abandoned.

FIG. 4 is a graph representing the (ZY) cut lithium niobate plate mode spectrum and coupling, ΔV/V to an interdigital transducer. The graph indicates a gap of greater than 11% between the Rayleigh mode and the first coupled plate mode, it being noted by the dots on the abscissa that many modes exist between the Rayleigh mode and the first coupled plate mode but such modes are electrically uncoupled. However, subsequent investigation has revealed that for narrow aperture transducers on a substrate of (ZY) cut lithium niobate, these nominally uncoupled plate modes adjacent to the Rayleigh mode are substantially affected by the sensitivity of the (ZY) cut lithium niobate substrate to the exact crystal cut, the exact transducer alignment along the Y axis, and the width of the transducer. Failure to meet precise specifications relating to the foregoing factors is responsible for causing these nominally uncoupled plate modes shown as dots on the abscissa of the graph comprising FIG. 4 to become coupled at plate mode levels in the −30 dB to −40 dB range. Moreover, diffraction in the finite width transducer produces an angular spectrum of electric potential components, and the off-axis components excite the near-in plate modes at small angles off the Y axis. Thus, spurious plate mode interference results in the acoustic response which is carried over in the electrical output signal of the transducer causing distortion of the electrical output signal. Accordingly, even through a (ZY) cut lithium niobate plate is theoretically ideal as the substrate in an acoustic surface wave filter device where it is desired to substantially eliminate spurious plate mode interference, the construction of such an exact crystal cut coupled with precise transducer alignment along the Y axis is in practice difficult to achieve. In this respect, misalignment of the transducer on the (ZY) cut lithium niobate substrate even to ¼° will result in electrical coupling of many of the nominally uncoupled plate modes shown as dots on the absicca of the graph of FIG. 4.

In accordance with the present invention, it is proposed to provide a monocrystalline plate-like body of lithium niobate having a crystalline lattice orientation of a character which substantially limits the number of plate modes available for coupling. In this sense, the most troublesome plate modes when the substrate is intended to be employed in an acoustic surface wave filter device are those modes having velocities very near to that of the Rayleigh mode because such plate modes are able to pass energy at frequencies in the pass band of the filter if electrically coupled. These plate modes are the so-called "near-in" plate modes. In order to eliminate these "near-in" plate modes, it is necessary that they be eliminated in the acoustic surface wave filter device, because they cannot be effectively discriminated against by other means. By so orienting the crystalline lattice orientation of a plate-like body of lithium niobate to maintain the first available plate mode in an uncoupled condition, while also providing for the velocity of the first coupled plate mode to be significantly higher than that of the Rayleigh mode, it has been determined that substantially all of the spurious plate modes are out of the pass band of an acoustic surface wave filter device employing such a lithium niobate body as a substrate and can additionally be discriminated against by the transmission system at a sufficiently high IF frequency. In this respect, the inverse velocity plot shown in FIG. 6 is employed for determining the maximum distance between the Rayleigh mode 23 and the tangent to the slow shear wave branch 22. However, within a range of angles between about 60° and 30° above the Y axis in FIG. 6, the shear mode curves are about 10% higher in velocity than the Rayleigh mode.

Figure 7:
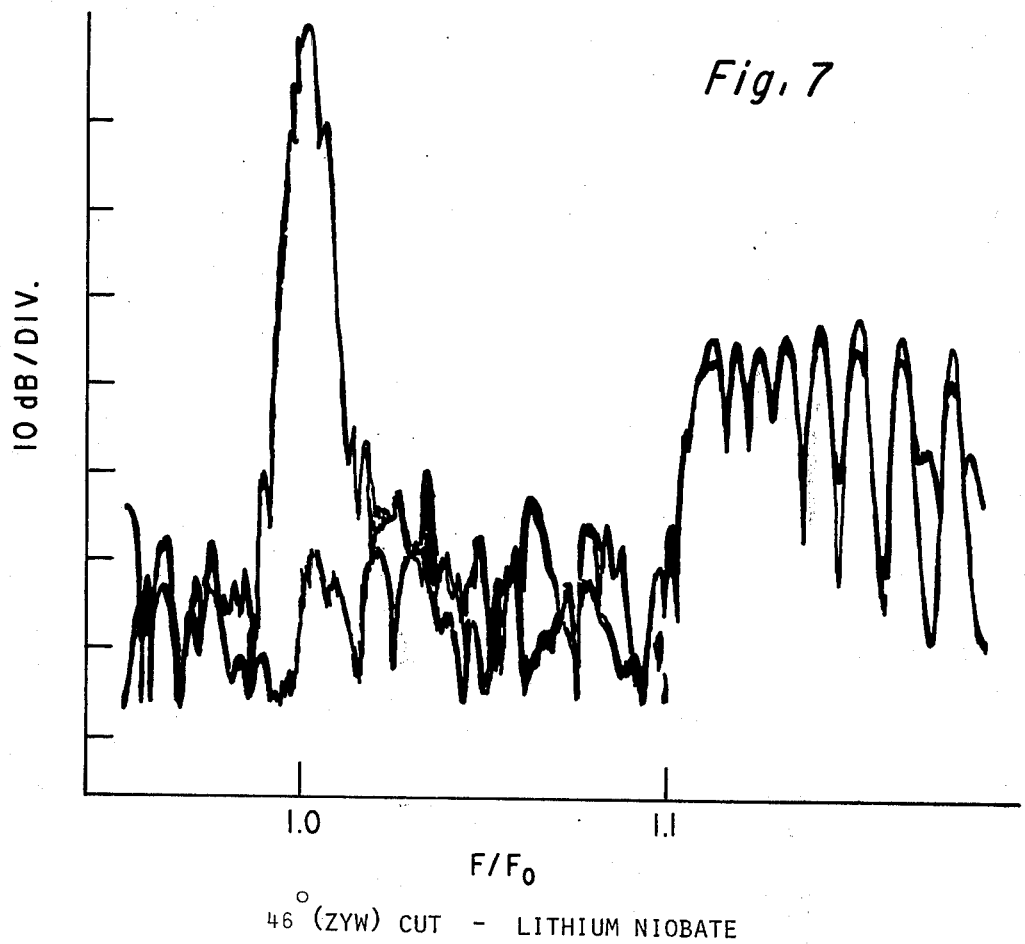
FIG. 7 is a graph of the acoustic surface wave response in dB vs. frequency and showing the signal tracing obtained from an acoustic wave filter device employing a substrate of 46° (ZYW) cut lithium niobate in accordance with the present invention.

FIG. 5 shows a graph plotting the plate mode coupling spectrum for a lithium niobate substrate with surface wave propagation at 46° about the Y axis, and with plate normal between −Y and +Z axes—thus, a 46° (ZYW) cut. It will be seen from FIG. 5 that there are no plate modes above the Rayleigh mode shown as having a relative velocity of 1.00 until a coupled plate mode appears at approximately a relative velocity of 1.10. In the graph illustrated in FIG. 5, the absence of dots on the abscissa in the region existing between the Rayleigh mode at a relative velocity of 1.00 and the first coupled plate mode at an approximate relative velocity of 1.10 is indicative of the fact that no plate modes are available in this region in either a coupled or uncoupled state in contrast to the showing in the graph of FIG. 4 of a (ZY) cut lithium niobate substrate. Confirmation of the plate mode spectrum shown in FIG. 5 was obtained by employing a 46° (ZYW) cut of a monocrystalline lithium niobate plate-like substrate in a narrow band acoustic surface wave filter device. The quiescent gap is clearly shown in FIG. 7 in the signal as between the Rayleigh mode signal shown at 1.0 and the beginning of the plate mode interference at approximately 1.1 relative frequency.

Figure 8:
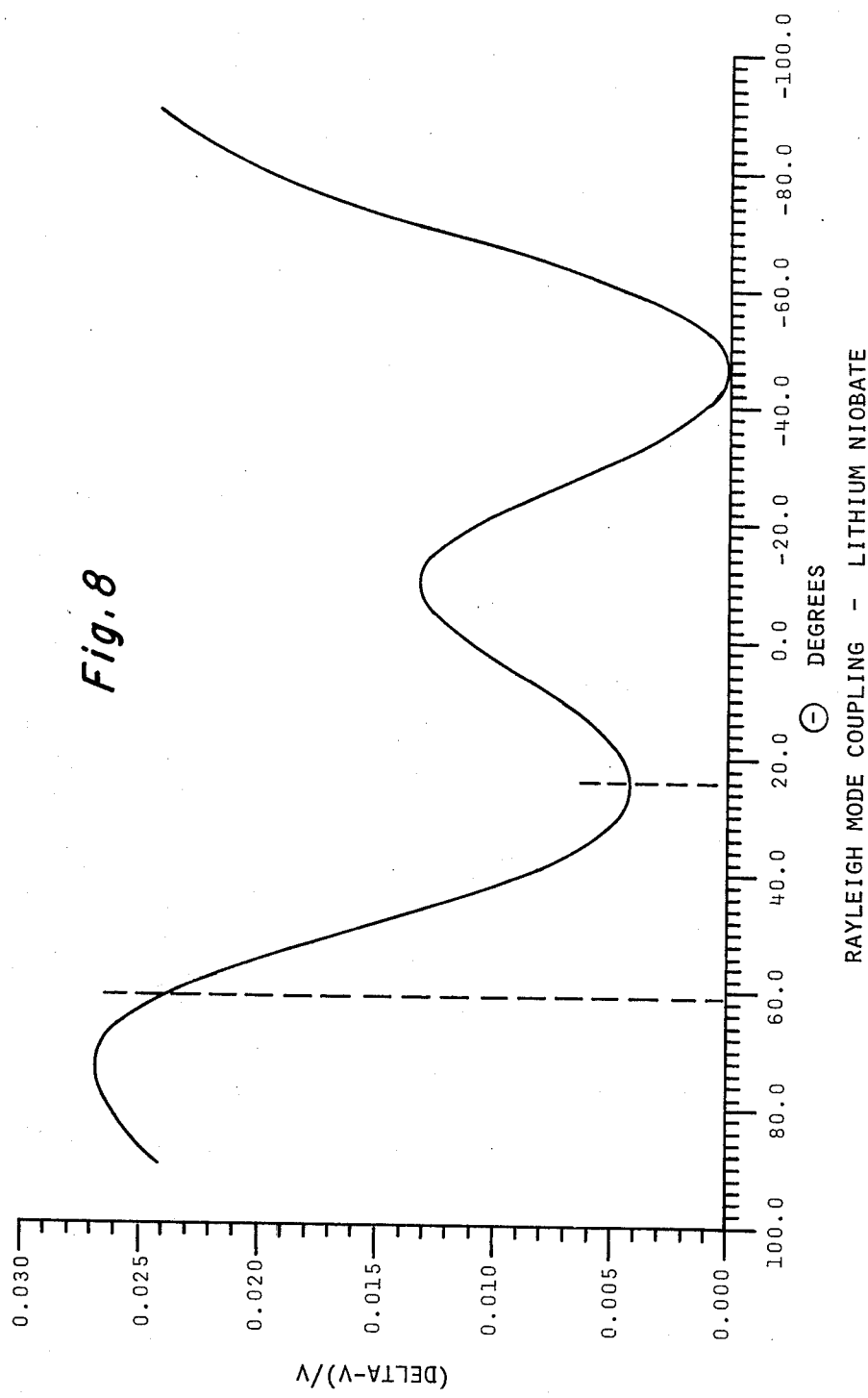
FIG. 8 is a graph representing the Rayleigh mode coupling strength for an X axis cylinder of lithium niobate.

FIG. 8 is a graph showing the Rayleigh mode coupling spectrum for an X-axis cylinder of lithium niobate, the range between the dashed lines being representative of the variance in the degree of Rayleigh mode coupling strength from the approximate 60.0° to the 24.0° (ZYW) cut range. FIG. 8 illustrates that the Rayleigh mode coupling within this range can vary from a value of approximately eight times that of the standard ST cut quartz substrate to a value of approximately 80% that of (YZ) cut lithium niobate. This variance in the degree of Rayleigh mode coupling strength enables an acoustic surface wave filter device to be so designed as to choose the Rayleigh mode coupling strength appropriate to the particular filter requirements.

Thus, it has been disclosed herein that cuts within an approximate range of 60°–30° (ZYW) cut lithium niobate offer superior characteristics in an acoustic surface wave filter device as compared to the commonly used (YZ) cut lithium niobate. Within the range of 60°–30° (ZYW) cut lithium niobate, the separation between the Rayleigh mode and plate modes occurs over the widest region, with the first coupled plate mode occurring at a velocity approximately 10% higher than that of the Rayleigh mode. Under these conditions, where the IF frequency is sufficiently high, the spurious plate modes are outside of the band of the Rayleigh mode response for an acoustic surface wave filter device using such a lithium niobate substrate with a crystalline lattice orientation as determined in accordance with the aforesaid 60° – 30° (ZYW) cut.

It will be understood by those skilled in the art that certain acoustically equivalent orientations are possible. In this respect, the Z axis of lithium niobate is a three-fold symmetry axis. Consequently, there are three crystallographically equivalent Y axes in the crystal. Thus, platelets cut from any of the three equivalent (ZY) planes according to the orientation specifications to achieve a 46° (ZYW) cut will be crystallographically equivalent. Additionally, it is known by those skilled in the art that the acoustic mode properties of a crystalline plate oriented according to a 46° (ZYW) cut are identical for propagation on either the top or bottom surface of the plate and for propagation along either the plus or minus B axis as shown in FIG. 1. To this end, it will be understood that references in the claims to a 46° (ZYW) cut or a range of 60°–30° (ZYW) cut of lithium niobate are intended to cover equivalent crystalline orientations as described.

It will be further understood that a limited angular deviation about the crystal X axis may be tolerated for a lithium niobate plately whose crystalline lattice orientation is in accordance with the particular range of cuts described herein. A lithium niobate structure as described herein is responsible for providing an improved acoustic surface wave filter device where it is the substrate in which the plate modes are discriminated against in an improved manner, thereby contributing to an overall improved filtering function for such devices enabling their use in special filtering applications involving television IF stages.

What is claimed is:

1. A piezoelectric body for use as a substrate in an acoustic surface wave filter device, said body comprising a monocrystalline member of lithium niobate of plate-like configuration and having a crystalline lattice orientation determined by a cut lying within the range of 60° – 30° (ZYW) cut so as to substantially limit the number of plate modes available for coupling, thereby enhancing the plate mode discrimination.

2. A piezoelectric body as set forth in claim 1, wherein the crystalline lattice orientation of said plate-like monocrystalline member of lithium niobate is determined by a 46° (ZYW) cut.

3. An acoustic surface wave filter device comprising a substrate of piezoelectric material,
   acoustic surface wave transducer means disposed on said substrate and responsive to an electrical input signal to propagate acoustic surface waves in said substrate, and
   said substrate being a monocrystalline plate-like body of lithium niobate having a crystalline lattice orientation as determined by a cut lying within the range of 60° – 30° (ZYW) cut so as to substantially limit the number of plate modes available for coupling upon excitation of said acoustic surface wave transducer means by the electrical input signal, thereby enhancing plate mode discrimination.

4. An acoustic surface wave filter device as set forth in claim 3, wherein said acoustic surface wave transducer means comprises input and output interdigital transducers disposed on said substrate in spaced apart relationship, ,
   said input interdigital transducer being responsive to an electrical input signal to propagate acoustic surface waves in said substrate, and
   said output interdigital transducer being responsive to acoustic surface waves propagated in said substrate to generate an electrical output signal.

5. An acoustic surface wave filter device as set forth in claim 4, wherein the crystalline lattice orientation of said plate-like monocrystalline substrate of lithium niobate is determined by a 46° (ZYW) cut.

* * * * *